(12) United States Patent
Chindalore et al.

(10) Patent No.: US 6,969,883 B2
(45) Date of Patent: Nov. 29, 2005

(54) NON-VOLATILE MEMORY HAVING A REFERENCE TRANSISTOR

(75) Inventors: Gowrishankar L. Chindalore, Austin, TX (US); Rajesh A. Rao, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/950,855

(22) Filed: Sep. 27, 2004

(65) Prior Publication Data

US 2005/0041503 A1    Feb. 24, 2005

Related U.S. Application Data

(62) Division of application No. 10/609,361, filed on Jun. 27, 2003.

(51) Int. Cl.$^7$ .............................................. H01L 29/76
(52) U.S. Cl. ..................... 257/314; 438/288
(58) Field of Search ................. 257/261, 296, 257/314, 315, 318–320, 326, 390; 365/185.01, 365/185.21, 185.24, 185.26, 184, 222; 438/201, 438/211, 257, 288

(56) References Cited

U.S. PATENT DOCUMENTS

| | | | |
|---|---|---|---|
| 5,172,338 A | | 12/1992 | Mehrotra et al. |
| 6,088,269 A | * | 7/2000 | Lambertson ............ 365/185.28 |
| 6,169,307 B1 | * | 1/2001 | Takahashi et al. ........... 257/315 |
| 6,246,607 B1 | * | 6/2001 | Mang et al. ............ 365/185.17 |
| 6,340,611 B1 | * | 1/2002 | Shimizu et al. ............. 438/201 |
| 6,342,715 B1 | * | 1/2002 | Shimizu et al. ............. 257/314 |
| 6,380,031 B1 | * | 4/2002 | Mehrad et al. ............. 438/257 |
| 6,414,876 B1 | | 7/2002 | Harari et al. |
| 6,444,554 B1 | * | 9/2002 | Adachi et al. .............. 438/587 |
| 6,597,035 B1 | * | 7/2003 | Harris ........................ 257/315 |
| 2002/0076850 A1 | * | 6/2002 | Sadd et al. ................... 438/90 |
| 2003/0230783 A1 | * | 12/2003 | Willer et al. ................ 257/390 |
| 2004/0155317 A1 | * | 8/2004 | Bhattacharyya ............. 257/616 |

* cited by examiner

*Primary Examiner*—Asok Kumar Sarkar
(74) *Attorney, Agent, or Firm*—Robert L. King; Daniel D. Hill

(57) ABSTRACT

A non-volatile memory (30) comprises nanocrystal memory cells (50, 51, 53). The program and erase threshold voltage of the memory cell transistors (50, 51, 53) increase as a function of the number of program/erase operations. During a read operation, a reference transistor (46) provides a reference current for comparing with a cell current. The reference transistor (46) is made from a process similar to that used to make the memory cell transistors (50, 51, 53), except that the reference transistor (46) does not include nanocrystals. By using a similar process to make both the reference transistor (46) and the memory cell transistors (50, 51, 53), a threshold voltage of the reference transistor (46) will track the threshold voltage shift of the memory cell transistor (50, 51, 53). A read control circuit (42) is provided to bias the gate of the reference transistor (46). The read control circuit (42) senses a drain current of the reference transistor (46) and adjusts the gate bias voltage to maintain the reference current at a substantially constant value relative to the cell current.

17 Claims, 5 Drawing Sheets

NON-VOLATILE MEMORY HAVING A REFERENCE TRANSISTOR

RELATED APPLICATION

This application is a divisional of application Ser. No. 10/609,361, filed Jun. 27, 2003.

FIELD OF THE INVENTION

This invention relates to integrated circuit memories, and more particularly to establishing a variable gate bias for a reference transistor in a non-volatile memory.

BACKGROUND OF THE INVENTION

In a typical non-volatile memory having floating gate transistors, such as flash memory, a bit is programmed by changing a threshold voltage of a selected floating gate memory cell. An unprogrammed, or erased, cell will have a different threshold voltage than a programmed cell. A read operation is used to determine the programmed state of the floating gate memory cell and is performed by applying a predetermined voltage to a gate of the selected memory cell while a source terminal of the cell is coupled to a predetermined voltage, such as for example, ground. A resulting drain current is compared to a reference current in a sense amplifier to determine the programmed state. For example, if the cell current is greater than the reference current, then the cell may be considered to be in an erased state. Likewise, if the cell current is less than the reference current, then the cell may be considered to be in a programmed state. The reference voltage, or current, is generally established to be about half way between a logic high voltage and a logic low voltage of the memory cells.

Several techniques have been used in the past to generate the reference voltage for memories that use voltage sensing. One technique used to generate the reference voltage depends on the use of "dummy cells". A dummy cell is manufactured using the same process technology as the normal cells of a memory array in order to model the behavior of the normal cells as closely as possible. However, the dummy cell will be physically smaller to generate a reference voltage that is between a logic high voltage and a logic low voltage for the cell. The problem with this technique is that reducing geometries of the cells produces process problems in keeping the time-current ratio of the dummy cell to normal cell constant.

Also, a dummy cell that is the same size as a normal cell can be used. However, a voltage divider is used to provide a reduced gate voltage to the normal sized cell.

Another technique is to connect normal sized dummy cells in series or parallel combinations. One of the cells will be programmed to read a "zero" state and the other programmed to read a "one" logic state to produce the required reference voltage. However, this technique may create errors due to the non-linearity of the resistance with voltage.

Yet another technique involves the use of current mirrors to establish the reference voltage. However, current mirrors sometimes do not produce the desired current with an acceptable degree of accuracy.

A nanocrystal memory uses nanocrystals embedded in an insulator such as oxide as the charge storage medium. In a nanocrystal memory that employs hot carrier injection for programming and channel erase for erasing, it has been found that electrons tend to be trapped in the interface between the top oxide and the bottom tunnel oxide in areas between the nanocrystals. These electrons cannot be removed even with extended erase times and/or very high erase voltages. As a result of this trapping of electrons, the erased threshold voltage and the programmed threshold voltage both tend to increase with the cumulative number of program/erase operations. This creates a problem when choosing a reference voltage for a read operation. If the reference voltage is too high, the gate oxide may be damaged and read speed will be degraded. However, if the reference voltage is chosen to be too low, the read margins will suffer.

Therefore, there is a need for a circuit that can generate an accurate reference voltage in a nanocrystal memory cell that maintains speed and read margins throughout the life of the memory.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides a non-volatile memory where the non-volatile memory cells comprise transistors having nanoclusters, or nanocrystals. The program and erase threshold voltages of the memory cell transistors increase as a function of the number of program/erase operations due to electron trapping. A data value stored in a selected memory cell is determined by comparing a cell current to a reference current. A reference transistor is used to provide the reference current. The reference transistor is made from a process similar to the one used to make the memory cell transistors, except that the reference transistor does not use nanoclusters. By using a similar process to make both the reference transistor and the memory cell transistors, a threshold voltage of the reference transistor will track the increasing memory cell transistor threshold voltage. A read control circuit is provided to bias the gate of the reference transistor. The read control circuit senses a drain current of the reference transistor and adjusts a gate bias, or voltage of the reference transistor to maintain the reference current at a substantially constant value relative to the cell current.

Figure 1:
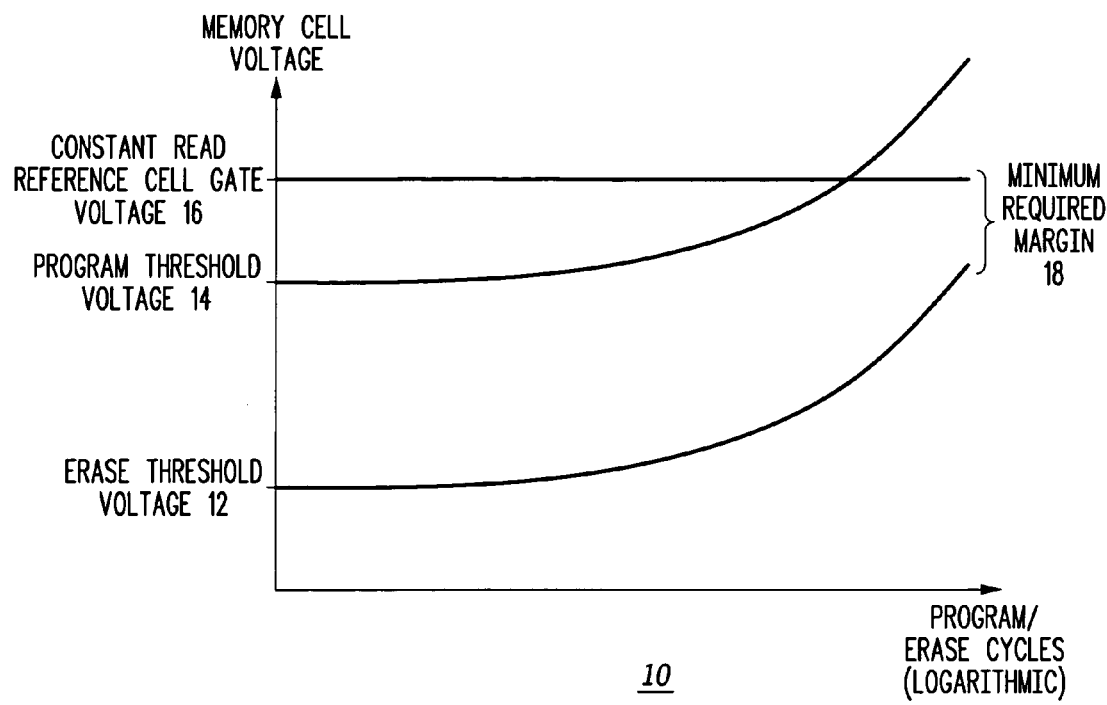
FIG. 1 is a graph for illustrating a constant read reference voltage and the program/erase threshold voltages of a nanocrystal memory as a function of the number of program/erase cycles.

FIG. 1 is a graph 10 for illustrating how an erase threshold voltage 12 and a program threshold voltage 14 of a nanocrystal memory increase with the number of program/erase cycles. In FIG. 1, a constant read reference cell gate voltage 16 is chosen to provide at least a minimum required margin 18 throughout the predicted life of the memory. However, a relatively high constant read reference cell gate voltage 16 may cause the gate oxide to be over stressed. In addition, a higher reference cell gate voltage 16 may reduce the operating speed of the memory. Furthermore, a charge pump may be necessary to provide the relatively high gate voltage, which can require a significant percentage of an integrated circuit to implement.

Figure 2:
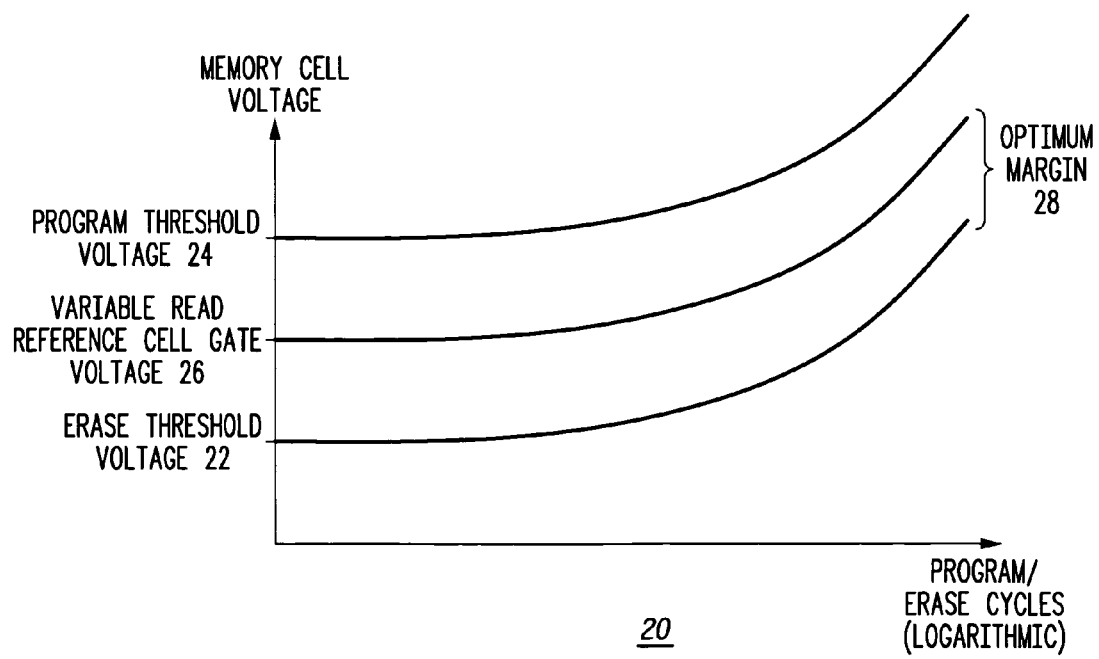
FIG. 2 is a graph for illustrating a variable read reference voltage and the program/erase threshold voltages of a nanocrystal memory as a function of the number of program/erase cycles.

FIG. 2 is a graph 20 for illustrating an erase threshold voltage 22 and a program threshold voltage 24 of a nanocrystal memory versus the number of program/erase cycles. A threshold voltage of a read reference cell tracks the program/erase threshold voltage of the normal memory cells. As the program/erase threshold voltage changes with the number of program/erase cycles, a variable read reference cell gate voltage 26 changes, thus maintaining an optimum voltage margin 28 between the program threshold voltage and the erase threshold voltage.

Figure 3:
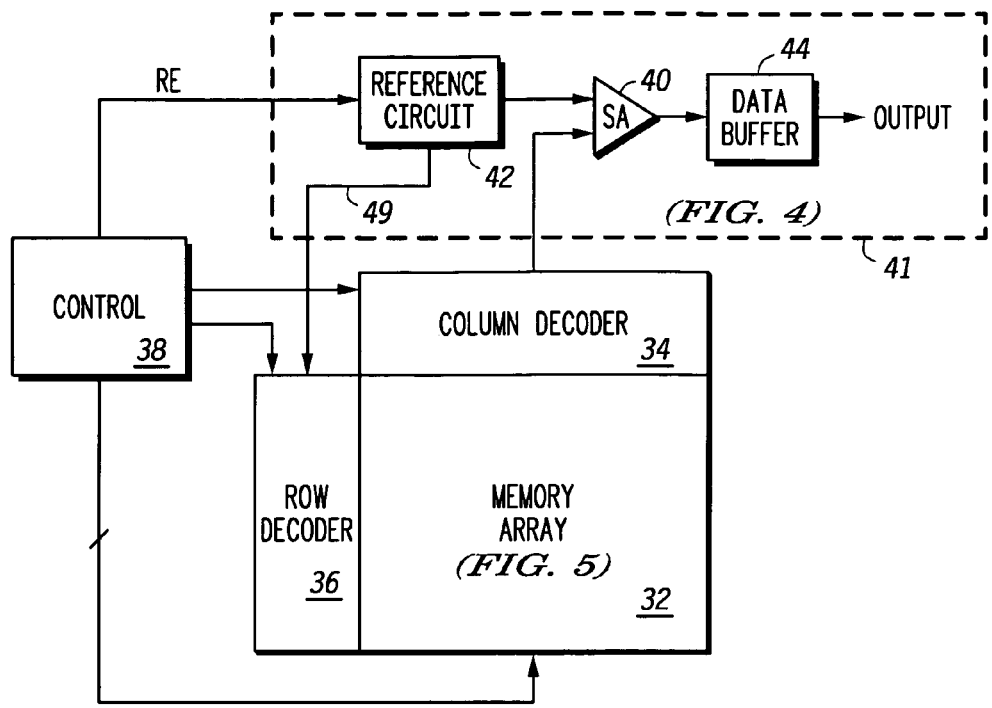
FIG. 3 illustrates a non-volatile memory in accordance with the present invention.

FIG. 3 illustrates a non-volatile memory 30 in accordance with the present invention. Memory 30 includes memory array 32, column decoder 34, row decoder 36, control block 38, and a read control circuit 41. Read control circuit 41 includes reference circuit 42, sense amplifier 40, and data output buffer 44, and is shown in more detail in FIG. 4. Memory 32 is an array of programmable non-volatile memory cells coupled to bit lines and word lines and is shown in more detail in FIG. 5. Row decoder 36 and column decoder 34 select one or more of the memory cells to be accessed in response to a plurality of address signals (not shown). Control block 38 provides control signals to control the operation of various portions of memory 30. For example, control block 38 provides a plurality of control signals to memory array 32 for controlling the application of some of the voltages necessary for programming, erasing, and reading the memory cells. Also, control block 38 provides control signals to row decoder 36 and column decoder 34 for controlling the timing of the address signals. In addition, control block 38 provides a read enable signal labeled "RE" to control the operation of reference circuit 42.

Reference circuit 42 provides a control signal 49 to row decoder 36, and provides a reference current to one input of sense amplifier 40. A second input of sense amplifier 40 is coupled to column decoder 34 for receiving a memory cell current from a selected memory cell. An output voltage representative of a logic state, or data value, stored in the selected memory cell is provided by sense amplifier 40 to output data buffer 44. Data buffer 44 then buffers and further amplifies the output voltage and provides a data signal labeled "OUTPUT". Also included in memory 30 but not shown is an input data path for receiving data to be programmed into memory array 32. The input data path components are conventional for a non-volatile memory and a functional description of their operation is not necessary for purposes of describing the present invention.

Figure 4:
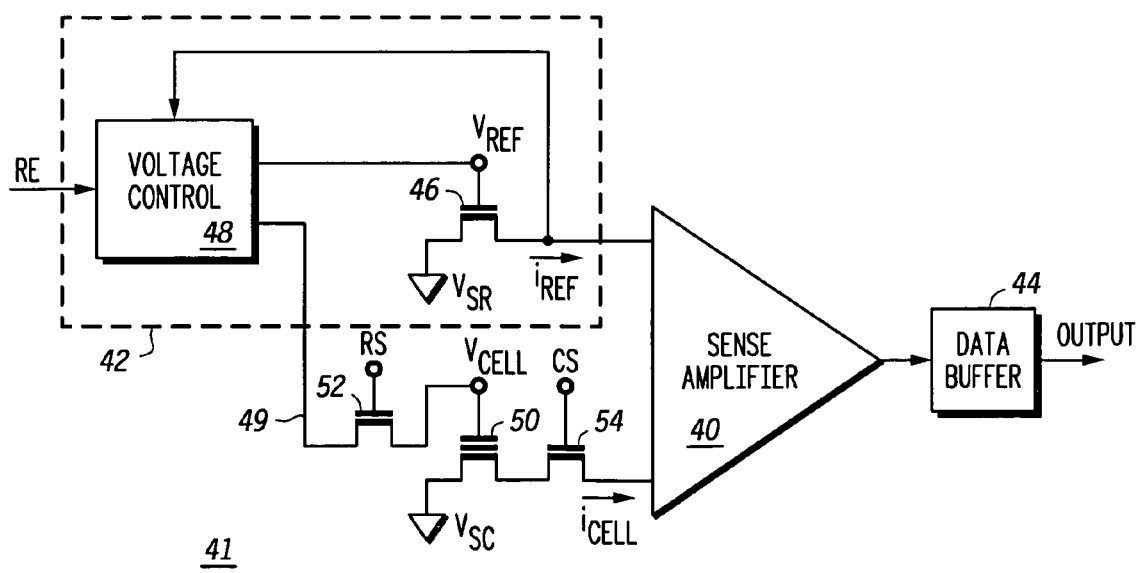
FIG. 4 illustrates the read control circuit of the memory of FIG. 3 in more detail.

FIG. 4 illustrates the read control circuit 41 of the memory of FIG. 3 in more detail. Read control circuit 41 includes reference circuit 42, reference transistor 46, row select transistor 52, memory cell 50, column select transistor 54, sense amplifier 40, and data output buffer 44.

Generally, memory array 32 includes a plurality of non-volatile memory cells that store information in response to changing a threshold voltage of the cell. Specifically, in the illustrated embodiment, memory array 32 includes a plurality of nanocrystal memory cells. Reference transistor 46 is fabricated to be the same as the memory cells of memory array 32, except that reference transistor 46 does not include the nanocrystals for storing information. Reference transistor 46 has a gate for receiving a reference voltage labeled "$V_{REF}$", a source terminal for receiving a source voltage labeled "$V_{SR}$", and a drain coupled to an input of sense amplifier 40. Memory cell 50 has a gate coupled to a drain/source terminal of row select transistor 52, a source terminal for receiving a source voltage labeled "$V_{SC}$", and a drain coupled to a drain/source terminal of column select transistor 54. The method for making memory array 32 and reference transistor 46 will be described in detail in the discussion of FIG. 6 through FIG. 11.

In order for the threshold voltage of reference transistor 46 to track the threshold voltage of memory array 32, reference transistor 46 will be cycled each time memory array 32 is cycled. That is, reference transistor 46 will receive the same program or erase voltage as memory array 32, and for the same length of time, each time memory array 32 is programmed or erased. Because transistor 46 is made using the same process steps as a normal memory cell, as described below, charge will be trapped at the interface between a top oxide and a bottom tunnel oxide that cannot be removed. The threshold voltage will change as the threshold voltage of the memory cells change in response to the number of program/erase cycles. The actual program and erase operations implemented in memory 30 are conventional, and are not important for describing the present invention, and will therefore not be described further.

During a read operation, a predetermined memory cell is selected to provide a current to one input of sense amplifier 40. In response to an address, a row select signal labeled "RS" is provided to the gate of a coupling transistor 52 and a column select signal labeled "CS" is provided to the gate of a coupling transistor 54. In response to a control signal labeled "RE", a reference voltage labeled "$V_{REF}$" is provided to the gate of reference transistor 46 and a gate voltage "$V_{CELL}$" is provided to the gate of a selected memory cell, for example, memory cell 50. Source voltages $V_{SC}$ and $V_{SR}$ are both at ground potential. The reference current $i_{REF}$ is provided to one input of sense amplifier 40, and the cell current $i_{CELL}$ is provided to the other input of sense amplifier 40. Sense amplifier 40 is a current sensing type of sense amplifier. Current sensing is typically used when the voltage difference between a logic high and a logic low cell voltage is relatively small. If cell current $i_{CELL}$ is greater than reference current $i_{REF}$, then memory cell 50 has a low threshold voltage and is in the erased state. However, if cell current $i_{CELL}$ is lower than reference current $i_{REF}$, then memory cell 50 has a high threshold voltage and is in the programmed state. In other non-volatile memories, a high threshold voltage may indicate an erased state and a low threshold voltage may indicate an erased state. Sense amplifier will provide an output voltage corresponding to the sensed state of the memory cell 50 to data output buffer 44. Data output buffer 44 will provide buffered output voltage OUTPUT to a circuit external to memory 30 (not shown).

As shown in FIG. 1 and FIG. 2, as the number of program and erase operations increase, the program and erase threshold voltage of the memory cells increase. Because reference transistor 46 is undergoing the same the program and erase operations as memory array 32, its threshold voltage will also increase, causing reference current $i_{REF}$ to decrease by a corresponding amount. During a read operation, reference current $i_{REF}$ is fed back to voltage control circuit 48. Voltage control 48 will adjust the gate voltage $V_{REF}$ of reference transistor 46 and cell voltage $V_{CELL}$ as a function of the decreasing reference current. The resulting cell voltage $V_{CELL}$ increases over time as the memory is programmed and erased, as illustrated in FIG. 2.

The use of a variable reference gate voltage in accordance with the present invention provides an accurate reference current in a nanocrystal memory cell that tracks the changing cell threshold voltages. This provides a nanocrystal memory that operates with optimum read margins throughout the life of the memory and maintains access speed.

Figure 5:
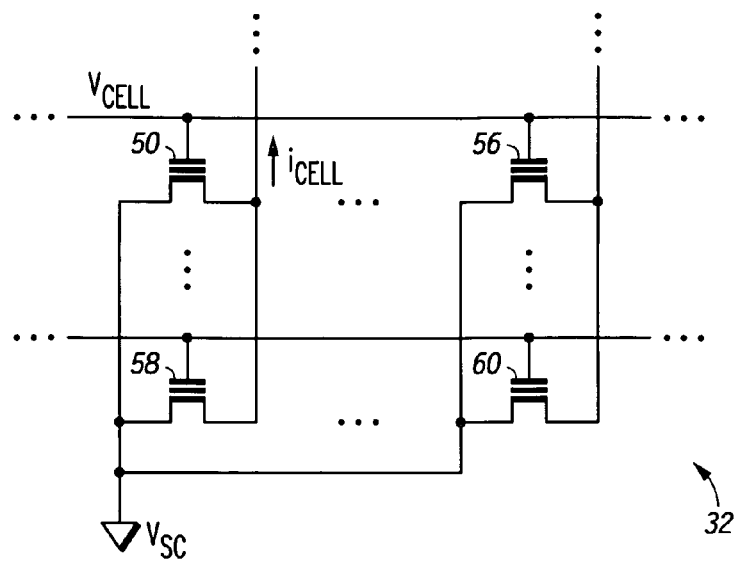
FIG. 5 illustrates the memory array of the memory of FIG. 3 in more detail.

FIG. 5 illustrates memory array 32 of the memory of FIG. 3 in more detail. Memory array 32 includes four representative nanocrystal memory cells 50, 56, 58, and 60. Memory array 32 is organized in rows and columns. For example, memory cells 50 and 58 form one "column" of memory cells and memory cells 50 and 56 form one "row" of memory cells. All of the cells in a row are coupled together to receive cell gate voltage $V_{CELL}$, and all of the drain terminals of a column of cells are connected together. Also, all of the floating gate transistors of memory array 32 have their source terminals connected together (common source) to receive source voltage $V_{SC}$. One memory cell is selected in response to an address to provide the cell current $i_{CELL}$ to sense amplifier 40 during a read operation as described above.

FIG. 6–FIG. 11 illustrate, in cross-sectional views, a method for making the nanocrystal memory array 32 and the reference cell 46 in an integrated circuit 62 in accordance with the present invention.

Figure 6:
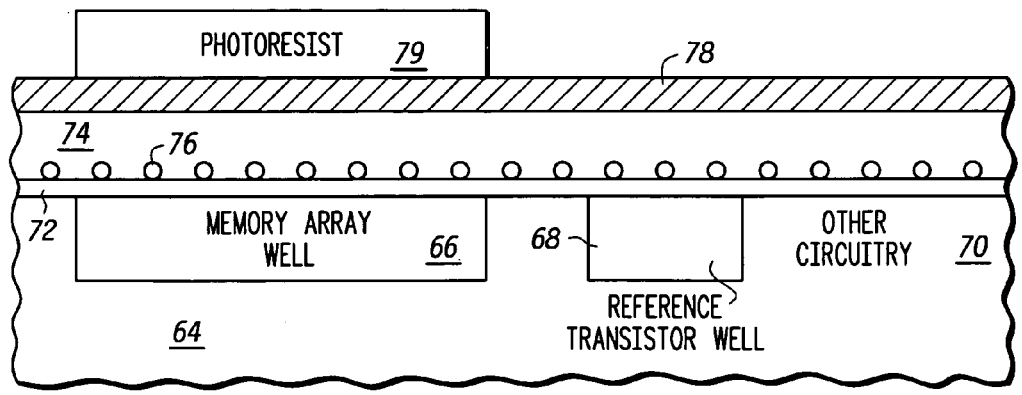
FIG. 6–FIG. 11 illustrate a method for making a nanocrystal memory array and a reference cell in accordance with the present invention.

In FIG. 6, a memory array well 66 and a reference cell well 68 are implanted in a predetermined area of semiconductor substrate 64. The memory array well 66 is formed to have a first predetermined doping concentration and the reference cell well 68 is formed to have a second predetermined doping concentration. The first and second doping concentrations may be the same or different. The choice of second predetermined doping concentration is determined by the natural threshold voltage value that is desired for the reference cell. In typical circuits, both the memory array well 66 and the reference cell well 68 are formed at the same time so that both the reference cell and the memory array cells have the same natural threshold voltage. Typical values for the doping concentration is $5–10 \times 10^{17}$ cm$^{-3}$ which results in natural threshold voltage in the range of 2–3V for the oxide stack described in this invention.

Other circuitry 70 may be formed in other areas of the substrate. The other circuitry 70 may include the peripheral circuits of memory 30, such as decoders or sense amplifiers, or other circuits such as a microprocessor core or random logic that may, or may not, communicate with the memory 30. A first dielectric layer 72 is formed over the substrate. In the illustrated embodiment, the first dielectric layer is formed by thermally growing silicon dioxide on the surface of substrate 64 to a thickness of about 50 angstroms. A storage material layer 76 is formed over first dielectric layer 72. In the illustrated embodiment, storage material layer 76 comprises nanocrystals or nanoclusters. The nanocrystals or nanoclusters are very small silicon dots for storing charge in the memory cells of the array. In another embodiment, the dots may be formed from nitride or germanium. In addition, the dots may be formed from any metal such as Silver, Platinum, Gold, Tungsten or Tantalum. The dots are spaced apart at least on some regions so as to not be in direct contact with each other. A second dielectric layer 74 is formed overlying and surrounding the storage material layer 76. Second dielectric layer 74 is formed from high temperature oxide and deposited to a thickness of about 100 angstroms.

A first barrier layer 78 is formed over the second dielectric layer 74. Barrier layer 78 is deposited nitride having a thickness of about 75 angstroms. Barrier layer 78 functions as a hardmask for subsequent processing steps and will be completely removed later. A layer of patterned photoresist 79 is deposited over first barrier layer 78 and patterned as shown in FIG. 6.

Figure 7:
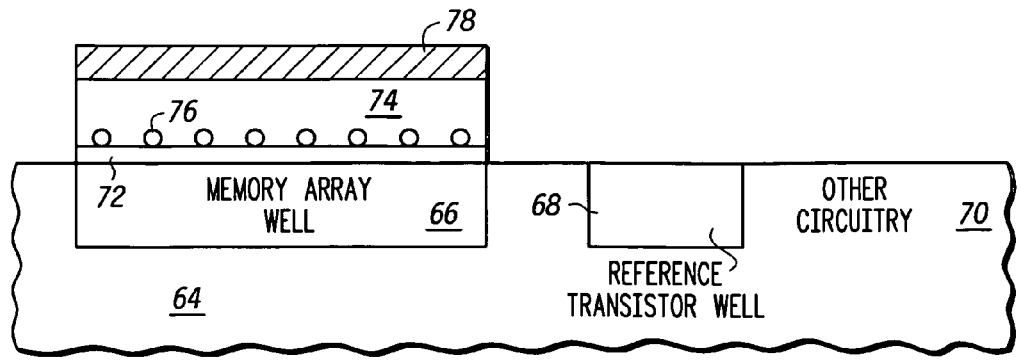

As illustrated in FIG. 7, first barrier layer 78, dielectric layers 74 and 72 and storage material layer 76 are removed from all areas except above memory array well 66. Photo resist 79 is then removed.

Figure 8:
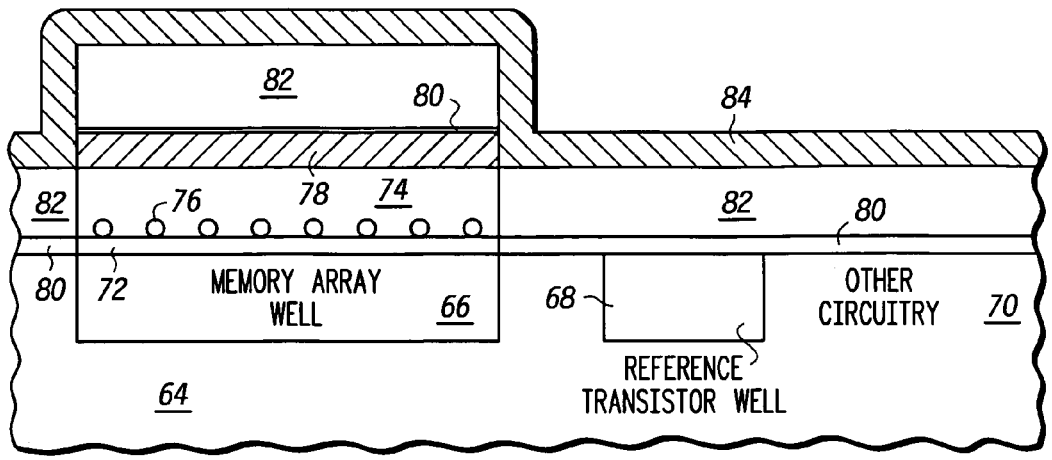

FIG. 8 illustrates the steps of forming a third dielectric layer 80 over substrate 64 and over first barrier layer 78. A fourth dielectric layer 82 is formed over third dielectric layer 80. A second barrier layer 84 is formed over the fourth dielectric layer 82. The thickness of the third dielectric layer 80 and that of the fourth dielectric layer 82 can be made same as the first dielectric layer 72 and the second dielectric layer 74, respectively. However, some circuit applications may require that the thickness of the third dielectric layer 80 and that of the fourth dielectric layer 82 be different than that of the first dielectric layer 72 and the second dielectric layer 74. Using the combination of doping concentration in reference cell well 68 and the thickness of the third dielectric layer 80 and that of the fourth dielectric layer 82, the natural threshold voltage of the reference transistor 46 (in FIG. 10) can be made the same or different than that of the memory array transistors.

Figure 9:
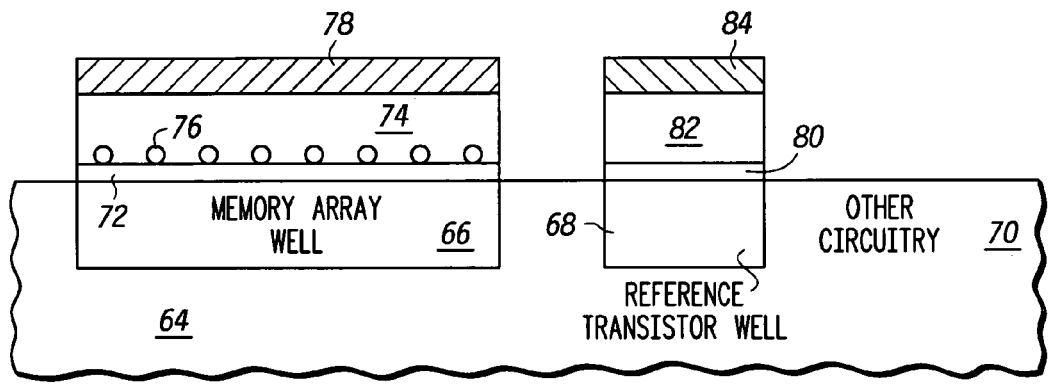
Figure 10:
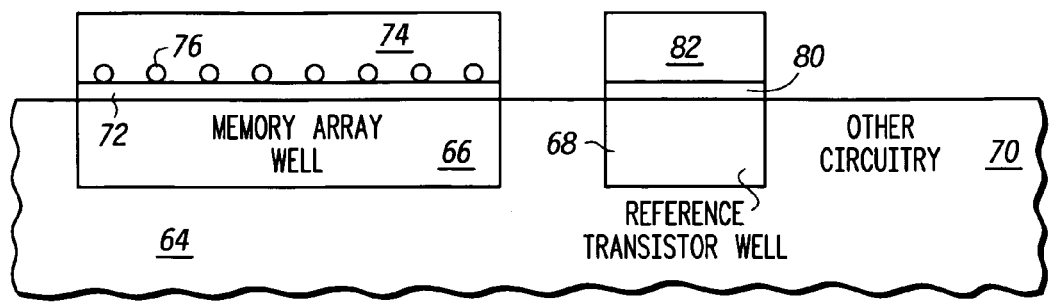

As illustrated in FIG. 9, the second barrier layer 84, the third dielectric layer 80, and the fourth dielectric layer 82 are removed from the integrated circuit 62 from everywhere except overlying the reference transistor well 68. The first barrier layer 78 over the memory array well 66 and the second barrier layer 84 over the reference transistor well remain. Any other thermal oxidation of the substrate as required for forming elements of the other circuitry 70 is carried out prior to removing the first and second barrier layers FIG. 10 illustrates the step of removing the second barrier layer 84 and the first barrier layer 78.

Figure 11:
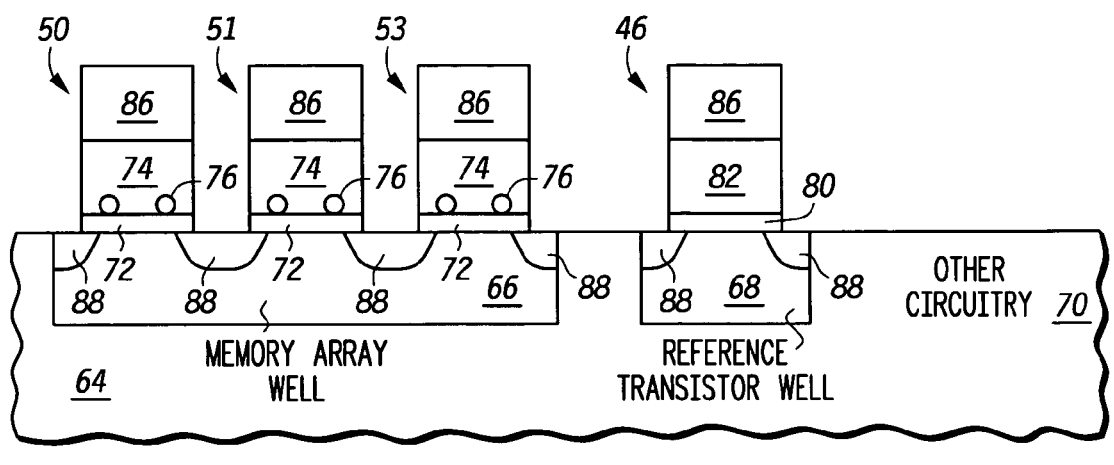

FIG. 11 is provided to illustrate that a conductive gate material 86 is deposited over the second dielectric layer 74 and the fourth dielectric layer 82. The gate material 86 may be polysilicon or a metal such as aluminum or copper. A masking operation is used to selectively remove gate material 86, dielectric layer 74, storage material layer 76 and first dielectric layer 72 to define gate stacks of transistors for memory cells 50, 51, and 53 of the array, and to define a gate stack for reference transistor 46. Source/drain regions 88 are then diffused into substrate 64. Note that the thickness of the gate stack of the reference transistor 46 may be different from the thickness of the gate stack of the memory cells. Also, in the interest of brevity and clarity, other normal processing steps are not shown. For example, sidewall spacers are typically formed on the sides of the gate stacks but are not shown.

Various changes and modifications to the embodiments herein chosen for purposes of illustration will readily occur to those skilled in the art. For example, variations in the types of conductivities of transistors, the types of transistors, etc. may be readily made. To the extent that such modifications and variations do not depart from the scope of the invention, they are intended to be included within the scope thereof, which is assessed only by a fair interpretation of the following claims.

What is claimed is:

1. A nonvolatile memory comprising:
   a substrate, wherein a first area of the substrate is for a memory array and a second area of the substrate is for a reference transistor;
   gate stack structures overlying the first area of the substrate, each of the gate stack structures comprising a first dielectric layer overlying the substrate, a storage material layer overlying the first dielectric layer, a second dielectric layer overlying and surrounding the storage material layer, and a gate material overlying the second dielectric layer; and
   the reference transistor having a reference transistor gate stack structure comprising a third dielectric layer and a fourth dielectric layer, the third dielectric and the fourth dielectric collectively permitting a threshold voltage of the reference transistor to vary with respect to program and erase operations of the nonvolatile memory over time, the reference transistor further comprising the gate material overlying the fourth dielectric layer.

2. The nonvolatile memory of claim 1 wherein the first dielectric, the second dielectric, the third dielectric and the fourth dielectric are comprised of differing compositions.

3. The nonvolatile memory of claim 1 wherein the storage material layer further comprises nanoclusters of at least one of silicon, nitride, germanium, silver, platinum, gold, tungsten, and tantalum.

4. The nonvolatile memory of claim 1 further comprising:
   a third area of the substrate, the third area containing other circuitry for use with the nonvolatile memory.

5. The nonvolatile memory of claim 1 further comprising:
   diffusion regions formed in the first area of the substrate for forming source and drain regions for the gate stack structures.

6. The nonvolatile memory of claim 1 wherein the third dielectric layer and the fourth dielectric layer of the reference transistor permit the reference transistor to have a variable threshold voltage as a function of a number of times the reference transistor is biased.

7. A nonvolatile memory array comprising:
   a substrate comprising a first area for a memory array and a second area for a reference transistor;
   a first dielectric layer overlying the first area of the substrate;
   a storage material layer overlying the first dielectric layer and the first area of the substrate;
   a second dielectric layer overlying and surrounding the storage material layer and overlying the first dielectric and the first area of the substrate;
   a third dielectric layer overlying only the second area of the substrate;
   a fourth dielectric layer overlying the third dielectric layer above the second area of the substrate;
   a conductive gate layer overlying the second dielectric in the first area of the substrate and overlying the fourth dielectric in the second area of the substrate;
   a plurality of gate stacks of transistors in the first area of the substrate and a reference gate stack in the second area of the substrate;
   current electrode regions in the first area of the substrate and the second area of the substrate that form memory cells in the first area of the substrate and a reference transistor in the second area of the substrate for providing a reference current to be compared with a memory cell current of a predetermined one of the memory cells in the first area of the substrate; and
   control circuitry coupled to the plurality of gate stacks of transistors in the first area of the substrate and to the reference gate stack in the second area of the substrate for providing a substantially same program or erase voltage for substantially a same length of time each time said memory array is programmed or erased.

8. The nonvolatile memory array of claim 7 wherein the storage material layer further comprises a layer of nanoclusters.

9. The nonvolatile memory array of claim 7 wherein said nanoclusters further comprise dots comprising at least one of silicon, nitride, germanium, silver, platinum, gold, tungsten, and tantalum that are spaced apart at least in some regions so as to not be in direct contact.

10. The nonvolatile memory of claim 7 further comprising:
    a third area of the substrate containing the control circuitry.

11. The nonvolatile memory of claim 7 wherein the first area of the substrate is a first well region having a first doping concentration and the second area of the substrate is a second well region having a second doping concentration, the first doping concentration being substantially equal to the second doping concentration.

12. The nonvolatile memory of claim 7 wherein the first area of the substrate is a first well region having a first doping concentration and the second area of the substrate is a second well region having a second doping concentration, the first doping concentration being different from the second doping concentration.

13. A semiconductor comprising:
    a substrate having a first region and a second region;
    a plurality of memory cell transistors in the first region of the substrate, each of the plurality of memory cell transistors comprising a gate stack structure comprising a gate dielectric and a layer of storage material having a predetermined height; and
    a reference transistor in the second region of the substrate, the reference transistor having a reference transistor gate stack structure comprising a first dielectric layer and a second dielectric layer, the first dielectric layer and the second dielectric layer collectively permitting the threshold voltage of the reference transistor to vary with respect to program and erase operations of the plurality of memory cell transistors over time.

14. The semiconductor of claim 13 wherein the first dielectric layer and the second dielectric layer comprise a material of substantially a same composition.

15. The semiconductor of claim 13 wherein the first dielectric layer and the second dielectric layer comprise materials of differing composition.

16. The semiconductor of claim 13 wherein the layer of storage material within the plurality of memory cell transistors comprises nanocrystals, the layer of storage material having at least some regions where the nanocrystals are physically spaced apart.

17. The semiconductor of claim 13 wherein the first dielectric layer and the second dielectric layer of the reference transistor collectively have a height substantially equal to the predetermined height.

* * * * *